US012689182B2

(12) United States Patent \
Dubey et al.

(10) Patent No.: US 12,689,182 B2 \
(45) Date of Patent: Jul. 21, 2026

(54) VERTICAL-CAVITY SURFACE-EMITTING LASER WITH ASYMMETRIC APERTURE FOR IMPROVED POLARIZATION STABILITY

(71) Applicant: Lumentum Operations LLC, San Jose, CA (US)

(72) Inventors: Richa Dubey, Milpitas, CA (US); Matthew Glenn Peters, Menlo Park, CA (US)

(73) Assignee: Lumentum Operations LLC, San Jose, CA (US)

( * ) Notice: Subject to any disclaimer, the term of this patent is extended or adjusted under 35 U.S.C. 154(b) by 577 days.

(21) Appl. No.: 18/348,933

(22) Filed: Jul. 7, 2023

(65) Prior Publication Data

US 2024/0348016 A1 Oct. 17, 2024

Related U.S. Application Data

(60) Provisional application No. 63/495,357, filed on Apr. 11, 2023.

(51) Int. Cl.
| | |
|---|---|
| *H01S 5/183* | (2006.01) |
| *H01S 5/068* | (2006.01) |
| *H01S 5/10* | (2021.01) |

(52) U.S. Cl.
CPC ...... *H01S 5/18338* (2013.01); *H01S 5/06821* (2013.01); *H01S 5/1096* (2013.01); *H01S 5/18394* (2013.01)

(58) Field of Classification Search
CPC .. H01S 5/068; H01S 5/06821; H01S 5/18338; H01S 5/18355; H01S 5/18394; H01S 5/1096
See application file for complete search history.

(56) References Cited

U.S. PATENT DOCUMENTS

| | | | |
|---|---|---|---|
| 5,331,654 A | 7/1994 | Jewell et al. | |
| 7,110,428 B2 * | 9/2006 | Jagadish | ............. H01S 5/18338 |
| | | | 372/44.01 |

(Continued)

OTHER PUBLICATIONS

K. D. Choquette et al., "Gain-Dependent Polarization Properties of Vertical-Cavity Lasers," IEEE Journal of Selected Topics in Quantum Electronics, vol. 1, No. 2, Jun. 1995, pp. 661-666.

(Continued)

*Primary Examiner* — James A Menefee \
(74) *Attorney, Agent, or Firm* — Harrity & Harrity, LLP

(57) ABSTRACT

A vertical-cavity surface-emitting laser (VCSEL) may include a substrate, a first mirror structure, and a cavity region to generate light. The cavity region may cause a resonance wavelength of a first portion of the light and a resonance wavelength of a second portion of the light to be offset from a gain peak of the VCSEL, where the first portion has a first polarization and the second portion has a second polarization, and an offset of the resonance wavelength of the first portion is different from an offset of the resonance wavelength of the second portion. The VCSEL may include a confinement aperture that has an asymmetric shape to cause spectral separation of the resonance wavelength of the first portion and the resonance wavelength of the second portion. The VCSEL may include a second mirror structure and one or more layers that form an output aperture.

20 Claims, 4 Drawing Sheets

100 — ➤

104

(56) References Cited

U.S. PATENT DOCUMENTS

| | | | | |
|---|---|---|---|---|
| 7,160,749 B2 * | 1/2007 | Chua | ................... | H01S 5/18355 |
| | | | | 438/46 |
| 7,333,522 B2 | 2/2008 | Ostermann et al. | | |
| 8,000,374 B2 | 8/2011 | Johnson et al. | | |
| 8,815,617 B2 | 8/2014 | Johnson et al. | | |
| 10,305,254 B2 | 5/2019 | Gazula et al. | | |
| RE48,577 E * | 6/2021 | Maeda | ................ | H01S 5/18391 |
| 2002/0172247 A1 * | 11/2002 | Sopra | ................. | H01S 5/18355 |
| | | | | 372/96 |
| 2009/0262770 A1 * | 10/2009 | Itoh | ..................... | H01S 5/18322 |
| | | | | 372/45.01 |
| 2011/0182314 A1 * | 7/2011 | Yoshikawa | ......... | H01S 5/18338 |
| | | | | 372/46.012 |
| 2022/0385040 A1 * | 12/2022 | Kubota | ................ | H01S 5/3202 |

OTHER PUBLICATIONS

K. D. Choquette et al., "Control of Vertical-Cavity Laser Polarization with Anisotropic Transverse Cavity Geometries," IEEE Photonics Technology Letters, vol. 6, No. 1, Jan. 1994, pp. 40-42.

M. P. van Exter et al., "Electro-Optic Effect and Birefringence in Semiconductor Vertical-Cavity Lasers," The American Physical Society, vol. 56, No. 1, Jul. 1997, pp. 845-853.

S. Miura et al., "Accurate Analysis of Crosstalk Between LP {11} Quasi-Degenerate Modes Due to Offset Connection Using True Eigenmodes," vol. 10, No. 1, Feb. 2018, pp. 1-12.

* cited by examiner

VERTICAL-CAVITY SURFACE-EMITTING LASER WITH ASYMMETRIC APERTURE FOR IMPROVED POLARIZATION STABILITY

CROSS-REFERENCE TO RELATED APPLICATION

This Patent Application claims priority to U.S. Provisional Patent Application No. 63/495,357, filed on Apr. 11, 2023, and entitled "VERTICAL-CAVITY SURFACE-EMITTING LASER WITH AN ASYMMETRIC APERTURE FOR IMPROVED POLARIZATION STABILITY." The disclosure of the prior Application is considered part of and is incorporated by reference into this Patent Application.

TECHNICAL FIELD

The present disclosure relates generally to a vertical-cavity surface-emitting laser (VCSEL) and to a VCSEL with an asymmetric aperture that causes separation of resonance wavelengths of portions of light having different polarizations.

BACKGROUND

A VCSEL is a semiconductor laser, more specifically a diode laser with a monolithic laser resonator, where light is emitted in a direction perpendicular to a chip surface. Typically, the laser resonator consists of two distributed Bragg reflector (DBR) mirrors parallel to a chip surface, between which is a cavity region (consisting of one or more quantum wells) that generates light. Commonly, the upper and lower mirrors of a VCSEL are doped as p-type and n-type materials, respectively, thereby forming a diode junction.

SUMMARY

In some implementations, a VCSEL includes a substrate; a first mirror structure over the substrate; a cavity region over the first mirror structure and to generate light, wherein the cavity region is to cause a resonance wavelength of a first portion of the light and a resonance wavelength of a second portion of the light to be offset from a gain peak of the VCSEL by at least a threshold amount, wherein the first portion of the light has a first polarization and the second portion of the light has a second polarization, and wherein an offset of the resonance wavelength of the first portion of the light from the gain peak is different from an offset of the resonance wavelength of the second portion of the light from the gain peak; a confinement layer that forms a confinement aperture adjacent to or near the cavity region, wherein the confinement aperture has an asymmetric shape to cause spectral separation of the resonance wavelength of the first portion of the light and the resonance wavelength of the second portion of the light; a second mirror structure over the confinement layer; and one or more layers that form an output aperture over the second mirror structure.

In some implementations, an emitter includes a cavity region to generate light, wherein the cavity region is to cause a first resonance wavelength of a first portion of the light having a first polarization to be offset from a gain peak of the emitter by a first amount, and wherein the cavity region is to cause a second resonance wavelength of a second portion of the light having a second polarization to be offset from the gain peak of the emitter by a second amount that is different from the first amount; a confinement layer that forms a confinement aperture, wherein the confinement aperture has a non-rotationally symmetric shape to cause spectral separation of the first resonance wavelength and the second resonance wavelength.

In some implementations, a device comprises a VCSEL comprising: a substrate; a first mirror structure; a cavity region to generate light, wherein one or more characteristics of the cavity region cause a resonance wavelength of a first portion of the light and a resonance wavelength of a second portion of the light to be offset from a gain peak of the VCSEL by at least a threshold amount, wherein a polarization of the first portion of the light is different from a polarization of the second portion of the light, and wherein the resonance wavelength of the first portion of the light is different from the resonance wavelength of the second portion of the light; a confinement layer that forms a confinement aperture, wherein a shape of the confinement aperture causes separation of the resonance wavelength of the first portion of the light and the resonance wavelength of the second portion of the light; a second mirror structure over the confinement layer; and one or more layers that form an output aperture over the second mirror structure.

DETAILED DESCRIPTION

Figure 1A:
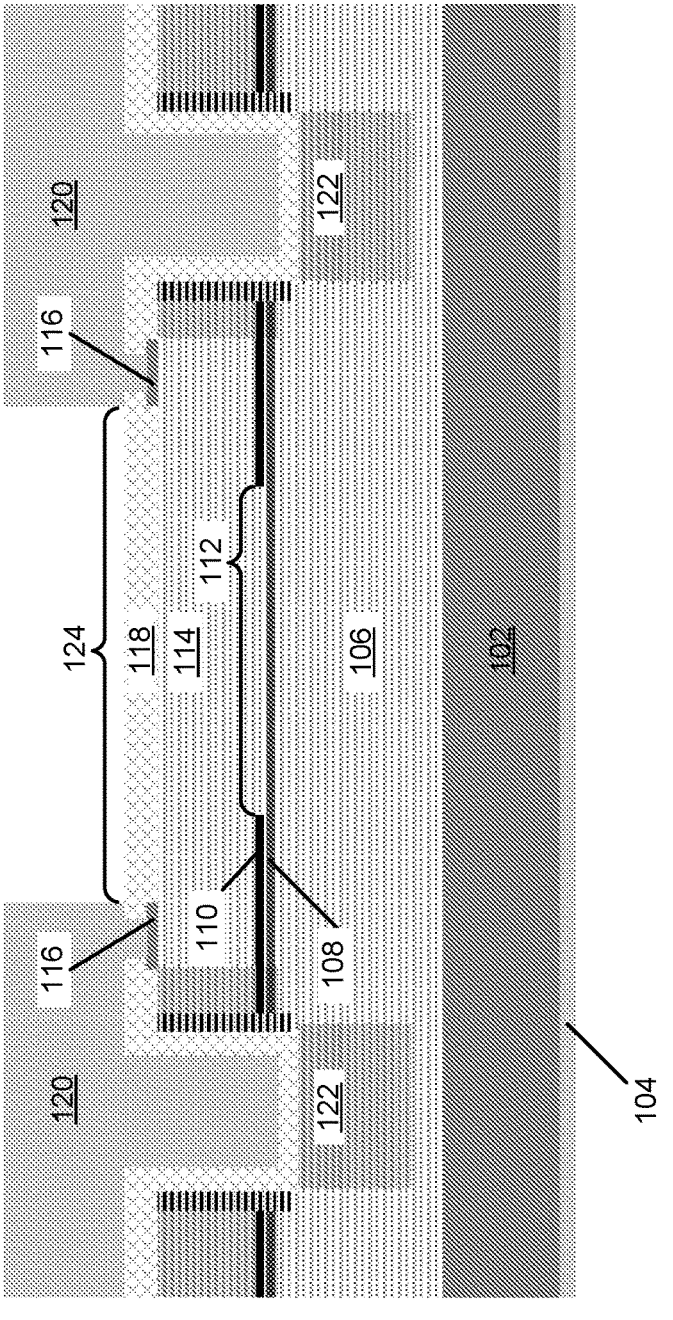
FIGS. 1A-1C are diagrams associated with an example implementation of a VCSEL including an asymmetric aperture.

The following detailed description of example implementations refers to the accompanying drawings. The same reference numbers in different drawings may identify the same or similar elements.

A conventional VCSEL has a cylindrical symmetric geometry, meaning that a confinement aperture and an output aperture of the VCSEL are circular in shape. This cylindrical symmetric geometry can cause the VCSEL to lase in degenerate modes. Degenerate modes are modes that have identical resonance wavelengths but different spatial patterns (i.e., different electric field distributions). For example, linearly polarized (LP) modes with azimuthal index 0 and radial index 1 (i.e., LP01 modes) have two-fold degeneracy, meaning that there can be two states of orthogonal polarization for the LP01 modes (and for other LP modes with azimuthal index of 0). As another example, LP modes with azimuthal index 1 and radial index 1 (i.e., LP11 modes) modes have four-fold degeneracy, meaning that there can be two states of orthogonal polarization and two spatial modes for each polarization for the LP11 modes (and other LP modes with azimuthal index greater than or equal to 1) Any two or more modes which have different resonance wavelengths and field distributions are referred to as non-degenerate modes.

Generally, degenerate modes are non-separable, and a VCSEL has no preferred polarization state. However, a VCSEL can generate uncontrolled birefringence due to, for example, electro-optic effects (e.g., caused by external or internal electric fields) or elasto-optic effects (e.g., caused by mechanical strain). The uncontrolled birefringence causes a small difference between resonance wavelengths of the degenerate modes of the VCSEL. As a result, the VCSEL may be slightly polarized, for example, in a direction corresponding to one of two crystal axis directions of a substrate (e.g., depending on a crystal axis orientation of the substrate). The directions of crystal axes of the substrate may dictate the direction of a linear polarization state. For example, for a substrate oriented in the [100] crystallographic direction, the [011] and [0-11] crystal axes become favorable polarization directions. Due to this slight polarization of the VCSEL, a change in an operating condition of the VCSEL (e.g., temperature, driving current, externally applied stress, or the like) can cause spontaneous change of polarization states of the VCSEL. This spontaneous change of polarization states is referred to as polarization flickering or polarization switching. Polarization flickering contributes to noise in an optical communication channel and, similarly, is detrimental to an application that needs stable polarization states. Further, the usage of a conventional VCSEL in an optical system that uses polarization sensitive optics may be impractical or impossible due to the likelihood of polarization flickering.

Some implementations described herein provide a VCSEL with improved polarization stability. In some implementations, the VCSEL described herein comprises one or more asymmetric apertures and a cavity region that provides at least a threshold amount of mismatch in a gain and resonance spectrum of the VCSEL. Here, the one or more asymmetric apertures and the threshold amount of mismatch in the gain and resonance spectrum improve stability of polarization states of the VCSEL by reducing or eliminating polarization flickering during operation of the VCSEL. Additional details are provided below.

Figure 1C:
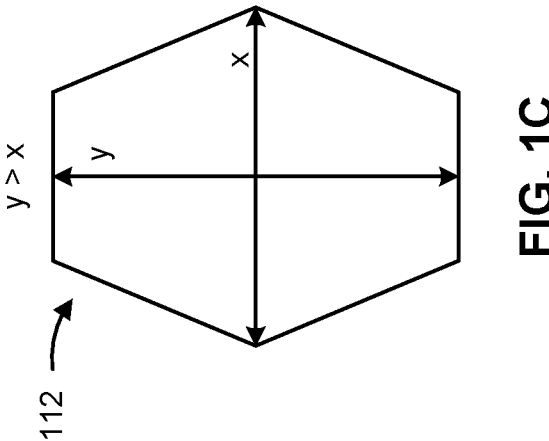
Figure 1B:
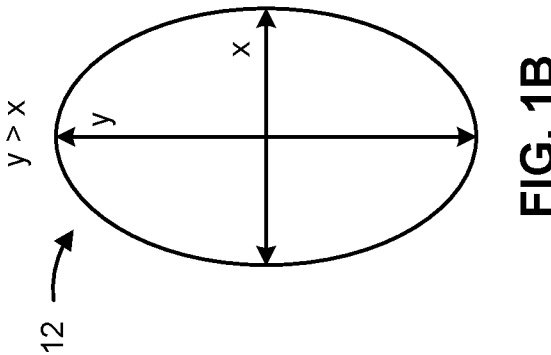

FIGS. 1A-1C are diagrams associated with an example implementation of a VCSEL 100 including an asymmetric aperture. In some implementations, the VCSEL 100 may be included in an array of emitters (e.g., an array of VCSELs 100). In some implementations, as illustrated in FIG. 1A, the VCSEL 100 is a top-emitting emitter. Alternatively, the VCSEL 100 may in some implementations be a bottom-emitting emitter (e.g., with a similar structure to that shown in FIG. 1A, with modifications to enable bottom-emitting). As shown in FIG. 1A, the VCSEL 100 may include a substrate 102, a bottom metal 104, a bottom mirror structure 106, a cavity including one or more an active regions (herein referred to as cavity region 108), a confinement layer 110 that forms a confinement aperture 112, a top mirror structure 114, a top contact layer 116, a dielectric layer 118, a top metal 120, and one or more isolation implants 122. As shown, one or more layers of the VCSEL 100 (e.g., the top contact layer 116, the dielectric layer 118, the top metal 120, or the like) may form an output aperture 124.

Substrate 102 includes a supporting material upon which, or within which, one or more layers or features of the VCSEL 100 are grown or fabricated. In some implementations, the substrate 102 comprises an n-type material. In some implementations, the substrate 102 comprises a semi-insulating type of material. In some implementations, the semi-insulating type of material may be used when the VCSEL 100 includes one or more bottom-emitting emitters in order to reduce optical absorption from the substrate 102. In such an implementation, the VCSEL 100 may include a contact buffer in or near the bottom mirror structure 106. In some implementations, the substrate 102 may be formed from a semiconductor material, such as gallium arsenide (GaAs), indium phosphide (InP), or another type of semiconductor material. In some implementations, a bottom contact (e.g., a bottom n-contact) of the VCSEL 100 can be made from a backside of the substrate 102. In some implementations, the bottom contact of the VCSEL 100 can be made from a front side of the VCSEL 100. In some implementations, the front side contact can be achieved by, for example, etching a mesa step or trench to the substrate 102, or inserting a contact buffer in or near the bottom mirror structure 106.

Bottom metal 104 includes a metal layer on a bottom surface of the substrate 102 (e.g., at a backside of the VCSEL 100). In some implementations, the bottom metal 104 is formed from an n-type material. In some implementations, the bottom metal 104 is a layer that makes electrical contact with the substrate 102. In some implementations, the bottom metal 104 serves as an anode for the VCSEL 100. In some implementations, the bottom metal 104 may include an annealed metallization layer, such as a gold-germanium-nickel (AuGeNi) layer, a palladium-germanium-gold (PdGeAu) layer, among other examples.

Bottom mirror structure 106 is a bottom reflector of an optical resonator of the VCSEL 100. For example, the bottom mirror structure 106 may include a DBR, a dielectric mirror, or another type of mirror structure. In some implementations, the bottom mirror structure 106 is formed from an n-type material. In some implementations, the bottom mirror structure 106 is on a top surface of the substrate 102. In some implementations, the bottom mirror structure 106 may have a thickness in a range from approximately 3.5 micrometers (μm) to approximately 9 μm, such as 5 μm. In some implementations, the bottom mirror structure 106 includes a set of layers (e.g., aluminum gallium arsenide (AlGaAs) layers) grown using a metal-organic chemical vapor deposition (MOCVD) technique, a molecular beam epitaxy (MBE) technique, or another technique.

Cavity region 108 includes one or more layers where electrons and holes recombine to emit light and define the emission wavelength range of the VCSEL 100. For example, the cavity region 108 may include one or more active regions in the form of one or more quantum wells (QWs). In some implementations, the cavity region 108 may include one or more cavity spacer layers (e.g., to enable epitaxial growth to have sufficient room for ramping compositions or temperature). In some implementations, the one or more cavity spacer layers may reduce strain between active regions of the cavity region 108 and/or may mitigate thermal issues of laser operation of the VCSEL 100. In some implementations, the one or more cavity spacer layers may include an oxidation layer. An optical thickness of the cavity region 108 (including the one or more active regions and any cavity spacer layers), the top mirror structure 114, and the bottom mirror structure 106 defines the resonant cavity wavelength of the VCSEL 100, which may be designed within an emission wavelength range of the cavity region 108 to enable lasing. In some implementations, the cavity region 108 may be formed on the bottom mirror structure 106. In some implementations, the cavity region 108 may have a thickness in a range from approximately 0.006 μm to approximately 0.5 μm, such as 0.15 μm or 0.30 μm. In some implementations, the cavity region 108 includes a set of layers grown using an MOCVD technique, an MBE technique, or another technique.

In some implementations, the cavity region 108 is designed such that resonance wavelengths of differently polarized portions of light generated by the VCSEL 100 are offset from a gain peak of the VCSEL 100 by at least a threshold amount. For example, the cavity region 108 may be designed such that a resonance wavelength of a first portion of the light generated by the VCSEL 100 (e.g., light having a first polarization, such as an x-polarization) is offset from a gain peak of the VCSEL 100 by a first amount, and such that a resonance wavelength of a second portion of the light generated by the VCSEL 100 (e.g., light having a second polarization, such as a y-polarization) is offset from the gain peak of the VCSEL 100 by a second (e.g., different) amount. Here, an offset of the resonance wavelength of the first portion of the light from the gain peak may be different from an offset of the resonance wavelength of the second portion of the light from the gain peak. In some implementations, the cavity region 108 is to cause a resonance wavelength of a portion of light generated by the VCSEL 100 to be offset from the gain peak by, for example, an amount in a range from approximately 8 nanometers (nm) to approximately 16 nm. That is, in some implementations, at least one of the offset of the resonance wavelength of the first portion of the light from the gain peak or the offset of the resonance wavelength of the second portion of the light from the gain peak may be in a range between approximately 8 nm and approximately 16 nm. In some implementations, the cavity region 108 may be designed such that the gain peak is blue-shifted with respect to the resonance wavelength of the first portion of the light and the resonance wavelength of the second portion of the light. Alternatively, the cavity region 108 may in some implementations be designed such that the gain peak is red-shifted with respect to the resonance wavelength of the first portion of the light and the resonance wavelength of the second portion of the light. Additional details regarding offsets of resonance wavelength offsets from the gain peak are described below with respect to FIGS. 2A-2C.

In some implementations, offsets of one or more of the resonance wavelengths from the gain peak can be tailored through selection of one or more material properties of the cavity region 108 or an active region of the cavity region 108. For example, in some implementations, offsets of one or more of the resonance wavelengths from the gain peak may be provided based on a material content of the cavity region 108. As one example, the cavity region 108 may include an active region comprising an indium gallium arsenide (InGaAs) QW. In such a case, offsets between the resonance wavelengths and the gain peak can be provided based on an indium (In) content of the InGaAs QW (e.g., based on an amount of In in the InGaAs QW). In such an example, the In content of the InGaAs QW may be in a range from approximately 6% to approximately 18% (e.g., for a 915 nm gain peak at room temperature). Notably, there is a wide range of active region compositions including Ga, In, aluminum (Al), arsenic (As), phosphorous (P), nitrogen (N), and/or antimony (Sb) to cover emission in a range of approximately 600 nm to approximately 1600 nm, and material content of the active region may depend on the active region composition in a given scenario.

As another example, offsets of one or more of the resonance wavelengths from the gain peak may be provided based on one or more characteristics of the active region of the cavity region 108. For example, the cavity region 108 may include an active region with one or more QWs and one or more QW barrier layers. In general, emission wavelength of the VCSEL 100 as a consequence of quantum confinement of electrons and holes is can be determined by a width (thickness) of one or more QWs. For example, the gain peak of the VCSEL 100 can be red-shifted by increasing the width of one or more QWs or, conversely, can be blue-shifted by decreasing the width of one or more QWs. Here, a thickness of the one or more QWs may be selected so as to provide the offsets of the resonance wavelengths from the gain peak. In some implementations, a thickness of a QW may be in a range from approximately 2 nm to approximately 16 nm. In some implementations, a width (thickness) of one or more QW barrier layers may be selected based on the width of the one or more QWs (e.g., so as to provide an active region with a desired total thickness). In some implementations, a thickness of a QW barrier layer may be in a range from approximately 2 nm to approximately 25 nm (e.g., for highest gain multiple QW active regions). In some implementations, a total thickness of the active region may be in a range from approximately 0.05 μm to approximately 0.15 μm, such as 0.05 μm.

Confinement layer 110 is a layer that provides optical and/or electrical confinement for the VCSEL 100. In some implementations, the confinement layer 110 enhances carrier and mode confinement of the VCSEL 100 and, therefore, can improve performance of the VCSEL 100. In some implementations, the confinement layer 110 is on, under, or in the cavity region 108. In some implementations, there may be one or more spacer layers or mirror layers (e.g., DBRs) between the confinement layer 110 and the cavity region 108. In some implementations, the confinement layer 110 is on a side of the cavity region 108 nearer to the bottom mirror structure 106 (i.e., on a substrate side of the cavity region 108). In some implementations, the confinement layer 110 is on a side of the cavity region 108 nearer to the top mirror structure 114 (i.e., on a non-substrate side of the cavity region 108).

In some implementations, the confinement layer 110 is an oxide layer formed as a result of oxidation of one or more epitaxial layers of the VCSEL 100. For example, the confinement layer 110 may be an aluminum oxide ($Al_2O_3$) layer formed as a result of oxidation of an epitaxial layer (e.g., an AlGaAs layer, an AlAs layer, and/or the like). In some implementations, the confinement layer 110 may have a thickness in a range from approximately 0.007 μm to approximately 0.04 μm, such as 0.02 μm. In some implementations, oxidation trenches (shown as filled in FIG. 1A) etched around the VCSEL 100 may allow steam to access the epitaxial layer(s) from which the confinement layer 110 is formed. In some implementations, the oxidation trenches may not fully enclose the confinement layer 110. For example, the oxidation trenches may follow the general shape of the confinement region, but there may be gaps between adjacent oxidation trenches. In some implementations, the confinement layer 110 may follow the general geometric shape, but may have variations associated with shapes or locations of the oxidation trenches and/or variations associated with an oxidation rate. In some implementations, in addition to the confinement layer 110, the VCSEL 100 may include one or more other types of structures or layers that provide current confinement, such as an implant passivation structure, a mesa isolation structure, a moat trench isolation structure, a buried tunnel junction, or the like. Additionally, or alternatively, such other types of structures or layers for providing current confinement may be included in or integrated with the confinement layer 110.

In some implementations, the confinement layer 110 defines the confinement aperture 112. Thus, in some implementations, the confinement aperture 112 is an optically active aperture defined by the confinement layer 110. In some implementations, a size (e.g., a width in a given direction) of the confinement aperture 112 is in a range from approximately 1 μm to approximately 300 μm, such as 5 μm or 8 μm. In some implementations, the confinement aperture 112 may be formed by oxidation (e.g., when the confinement layer 110 is an oxidized layer). Additionally, or alternatively, the confinement aperture 112 may be formed by other means, such as by implantation, diffusion, regrowth (e.g., using a high resistance layer, a current blocking layer, a tunnel junction, or the like), or an air gap, among other examples.

In some implementations, the confinement aperture 112 has an asymmetric shape. That is, the confinement layer 110 may be formed such that the confinement aperture 112 has a shape that is non-rotationally symmetric. For example, the confinement aperture 112 may have an elliptical shape, an oval shape, a rectangular shape, a diamond shape, or a hexagonal shape, among other examples. FIGS. 1B and 1C are diagrams illustrating examples of confinement apertures 112 having an elliptical shape and a hexagonal shape, respectively. As noted, a size of the confinement apertures 112 shown in FIGS. 1B and 1C with respect to a first direction (e.g., an x-direction) is less than a size of the confinement apertures 112 with respect to a second direction (e.g., a y-direction). In practice, the confinement aperture 112 may have any shape in which the aspect ratio x:y is less than 1 or is greater than 1. That is, the confinement aperture 112 may have any shape in which the aspect ratio x:y is not equal to 1.

In some implementations, the asymmetric shape of the confinement aperture 112 causes spectral separation of the resonance wavelength of the first portion of the light generated by the VCSEL 100 and the resonance wavelength of the second portion of the light generated by the VCSEL 100. For example, a difference between the resonance wavelength of the first portion of light and the resonance wavelength of the second portion of light may in some implementations be in a range from approximately 0.015 nm to approximately 0.020 nm. In some implementations, the spectral separation provided by the asymmetric confinement aperture 112 enables polarization gain-dependence to be utilized to cause one state of polarization to dominate over another in operation of the VCSEL 100 (e.g., as described below with respect to FIGS. 2A-2C). For example, the asymmetric confinement aperture 112 can enable well-defined non-degenerate polarization states. In some implementations, axial birefringence in the VCSEL 100 with the asymmetric confinement aperture 112 provides different effective indices (e.g., in different directions) and, therefore, separate resonance wavelengths in the axial direction. The spectral separation between the polarization states of the VCSEL 100 can be tailored by tuning the aspect ratio x:y of the asymmetric confinement aperture 112. Additional details regarding spectral separation of the resonance wavelengths are described below with respect to FIGS. 3A and 3B.

Top mirror structure 114 is a top reflector of the optical resonator of the VCSEL 100. For example, the top mirror structure 114 may include a DBR, a dielectric mirror, and/or the like. In some implementations, the top mirror structure 114 is formed from a p-type material. In some implementations, the top mirror structure 114 may have a thickness in a range from approximately 1 μm to approximately 6 μm, such as 3 μm. In some implementations, the top mirror structure 114 includes a set of layers (e.g., AlGaAs layers) grown using an MOCVD technique, an MBE technique, or another technique. In some implementations, the top mirror structure 114 is grown on or over the cavity region 108.

In some implementations, a total thickness from a bottom surface of the bottom mirror structure 106 to a top surface of the top mirror structure 114 may be in a range from, for example, approximately 4.5 μm to approximately 26.4 μm, such as approximately 8.6 μm. In some implementations, a thickness of one or more of the layers of the VCSEL 100 may be selected in order to provide a structure that achieves high reflectivity (e.g., greater than approximately 99% reflectivity). In some implementations, a smaller total thickness may facilitate growth time reduction of the VCSEL 100 or stress reduction within the VCSEL 100.

The top contact layer 116 is a top contact layer of the VCSEL 100 that makes electrical contact with the top mirror structure 114 through which current may flow. In some implementations, the top contact layer 116 includes an annealed metallization layer. For example, the top contact layer 116 may include a chromium-gold (Cr—Au) layer, a gold-zinc (Au—Zn), a titanium-platinum-gold (TiPtAu) layer, a gold-germanium-nickel (AuGeNi) layer, a palladium-germanium-gold (PdGeAu) layer, or the like. In some implementations, the top contact layer 116 has a thickness in a range from approximately 0.03 μm to approximately 0.3 μm, such as 0.2 μm. In some implementations, the top contact layer 116 has a ring shape, a slotted ring shape, a tooth wheel shape, or another type of circular or non-circular shape (e.g., depending on a design of the VCSELs in the VCSEL 100).

Dielectric layer 118 is a layer that at least partially insulates the top metal 120 from one or more other layers or features (e.g., sidewalls of trenches). In some implementations, the dielectric layer 118 may comprise, for example, silicon nitride (SiN), silicon dioxide ($SiO_2$), a polymer dielectric, or another type of insulating material.

The top metal 120 is a top metal layer at a front side of the VCSEL 100. In some implementations, the top metal 120 is formed from a p-type material. Alternatively, in some implementations, the top metal 120 is formed from an n-type material. In some implementations, the top metal 120 may be a layer that makes electrical contact with the top contact layer 116. In some implementations, the top metal 120 may serve as a cathode for the VCSEL 100.

Isolation implant 122 is a region to prevent free carriers from reaching edges of trenches and/or to isolate adjacent VCSELs 100 from one another (e.g., if the trenches do not fully enclose the VCSELs of the VCSEL 100). Isolation implant 122 may comprise, for example, an ion implanted material, such as a hydrogen/proton implanted material or a similar implanted element to reduce conductivity.

The output aperture 124 is an aperture of the VCSEL 100 through which light is emitted. As shown, the output aperture 124 may be defined by one or more layers of the VCSEL 100, such as the top contact layer 116, the dielectric layer 118, or the top metal 120. In some implementations, a size (e.g., a width in a given direction) of the output aperture 124 is in a range from approximately 1 μm to approximately 300 μm, such as 5 μm or 8 μm.

In some implementations, the output aperture 124 has an asymmetric shape. That is, the output aperture 124 may be formed such that the output aperture 124 has a shape that is non-rotationally symmetric. For example, the output aperture 124 may have an elliptical shape, an oval shape, a rectangular shape, a diamond shape, or a hexagonal shape, among other examples. In some implementations, the output aperture 124 may have a same size or same shape as the confinement aperture 112 (e.g., the examples shown in FIGS. 1B and 1C are applicable to the output aperture 124). That is, a shape or a size of the output aperture 124 may in some implementations match (within a tolerance) a shape or a size of the confinement aperture 112. In some implementations, a size of the output aperture 124 with respect to a first direction (e.g., an x-direction) is less than a size of the output aperture 124 with respect to a second direction (e.g., a y-direction). In practice, the output aperture 124 may have any shape in which the aspect ratio x:y is not equal to 1. In some implementations, the output aperture 124 is aligned with the confinement aperture 112 (within a tolerance).

In some implementations, the asymmetric shape of the output aperture 124 causes further spectral separation of the resonance wavelength of the first portion of the light generated by the VCSEL 100 and the resonance wavelength of the second portion of the light generated by the VCSEL 100. That is, the asymmetric shape of the output aperture 124 may serve to increase the spectral separation of the resonance wavelength of the first portion of the light and the resonance wavelength of the second portion of light (e.g., in addition to spectral separation provided by the confinement aperture 112). In some implementations, the spectral separation that is provided or improved by the asymmetric output aperture 124 enables polarization gain-dependence to be utilized to cause one state of polarization to dominate over another in operation of the VCSEL 100 (e.g., as described below with respect to FIGS. 2A-2C). In some implementations, the spectral separation between the polarization states of the VCSEL 100 can be tailored by tuning the aspect ratio x:y of the output aperture 124. Additional details regarding spectral separation of the resonance wavelengths are described below with respect to FIGS. 3A and 3B.

In this way, the VCSEL 100 may achieve improved polarization stability (e.g., as compared to a conventional VCSEL). That is, the one or more asymmetric apertures (e.g., the confinement aperture 112 and/or the output aperture 124) and the cavity region 108 that provides at least a threshold amount of mismatch in a gain and resonance spectrum of the VCSEL 100 may improve polarization stability of the VCSEL 100 by reducing or eliminating polarization flickering during operation of the VCSEL. As a result, noise in the VCSEL 100 in an optical communication channel attributable to polarization flickering may be reduced or eliminated, the VCSEL 100 may be suitable for use in an application that needs stable polarization states, and/or the VCSEL 100 may be used in an optical system that uses polarization sensitive optics.

Further, the techniques and apparatuses described herein with respect to the VCSEL 100 are more efficient from an approach in which birefringence is generated using local stress. The techniques and apparatuses described herein that use asymmetry to create birefringence is more controllable, repeatable, and stable than the stress-based approach. Further, since the techniques and apparatuses described herein do not require epitaxial modifications, these techniques and apparatuses are less expensive and less complex than an approach in which epitaxial modifications are needed. Here, since a process of fabricating an asymmetric aperture is the same as that of fabricating a symmetric aperture, fabrication does not require any additional or complex processing steps.

The number, arrangement, thicknesses, order, symmetry, or the like, of layers shown in FIG. 1A are provided as an example. In practice, the VCSEL 00 may include additional layers, fewer layers, different layers, differently constructed layers, or differently arranged layers than those shown in FIG. 1A. For example, as noted above, the VCSEL 100 may in some implementations be a bottom-emitting VCSEL, and a structure similar to that shown in FIG. 1A may utilized for bottom emission, with appropriate modification to support bottom emission (e.g., an output aperture can be formed at a bottom of the VCSEL rather than a top of the VCSEL).

Additionally, or alternatively, a set of layers (e.g., one or more layers) of the VCSEL 100 may perform one or more functions described as being performed by another set of layers of the VCSEL 100, and any layer may comprise more than one layer. Further, as indicated above, FIGS. 1B and 1C are provided as examples. Other examples may differ from what is described with regard to FIGS. 1B and 1C.

Figures 2A, 2B, 2C:
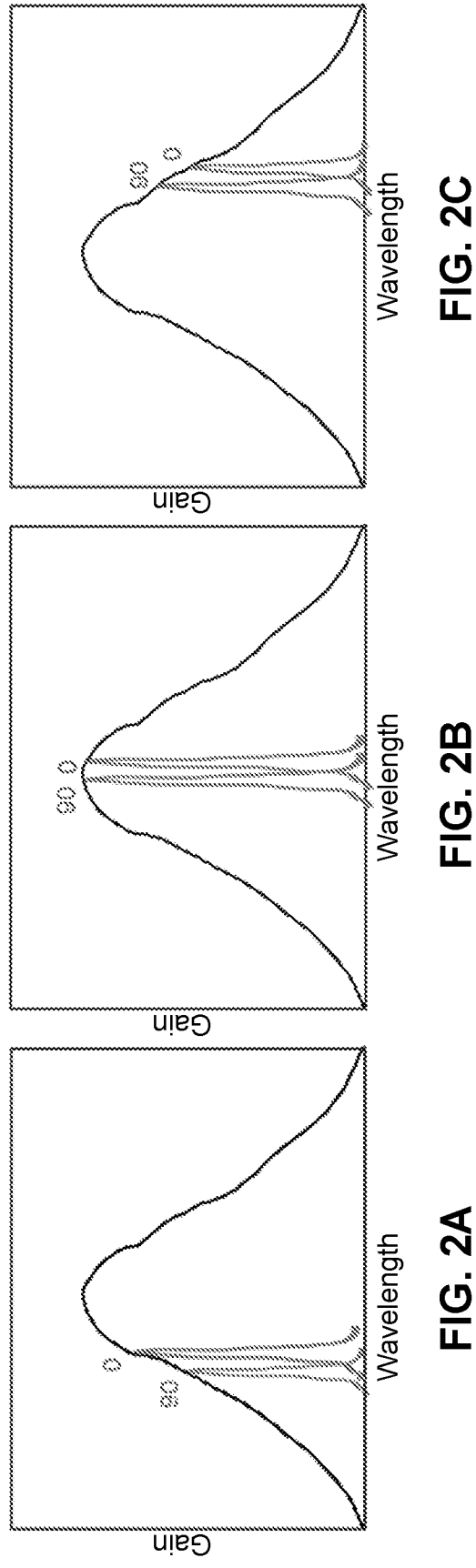
FIGS. 2A-2C are diagrams illustrating examples of offsets of resonance wavelengths of light generated by the VCSEL from a gain peak of the VCSEL including the asymmetric aperture.

FIGS. 2A-2C are diagrams illustrating examples of offsets of resonance wavelengths of light generated by the VCSEL 100 from a gain peak of the VCSEL 100.

In some implementations, gain-dependent polarization can help to stabilize orthogonal linear polarization states of the VCSEL 100. In practice, a partitioning of power into two polarizations (e.g., two orthogonal eigen-polarizations) of the VCSEL 100 depends on a relative spectral overlap of non-degenerate polarization cavity resonances with a gain spectrum. In some implementations, such power partitioning can be achieved by establishing a mismatch between the gain peak (i.e., the peak of the laser gain spectrum) and the resonance wavelengths. In some implementations, the VCSEL 100 may be designed with a relatively narrow gain spectrum with relatively steeper slopes on the sides or relatively high mirror loss to facilitate power partitioning between the two polarization states. In some implementations, a gain spectrum with relatively steeper slopes achieves improved power partitioning and an improved polarization extinction ratio (PER).

In a conventional VCSEL with resonance wavelengths substantially aligned to the gain peak (an example of which is illustrated in FIG. 2B, which shows a 0 degree (°) polarization state and a 90° polarization state), a dominant state of polarization can switch abruptly as, for example, a red-shifting gain curve sweeps through the resonance wavelengths (e.g., due to ohmic heating). To avoid this, the cavity region 108 of the VCSEL 100 is designed such that the gain peak is either red-shifted or blue-shifted with respect to the resonance wavelengths of the differently polarized light generated by the VCSEL 100. FIG. 2A illustrates an example of a red-shift of the gain peak with respect to the resonance wavelengths of the different polarization states (e.g., the 0° polarization state and the 90° polarization state). FIG. 2C illustrates an example of a blue-shift of the gain peak with respect to the resonance wavelengths of the different polarization states (e.g., the 0° polarization state and the 90° polarization state). Here, a shift (e.g., a red-shift or a blue-shift) of the gain peak provides the offsets of the resonance wavelengths from the gain peak. These (different) offsets allow the VCSEL 100 to maintain the dominant state of polarization even when operation conditions of the VCSEL 100 change. For example, in the case of a change in temperature, the gain peak may shift by approximately 0.3 nm per degree Celsius (nm/° C.), while the resonance wavelengths may shift by approximately 0.07 nm/deg C. Here, the resonance wavelengths being on a given side of the gain curve would still result in the same dominant state of polarization because there would be no sweep of the gain peak. In some implementations, between 8 nm and 16 nm of shift (e.g., blue-shift) of the gain peak from at least one resonance wavelength (e.g., a resonance wavelength nearer to the gain peak) might enable lasing operation of the VCSEL 100 with a single dominant polarization state through the onset of higher order modes.

As indicated above, FIGS. 2A-2C are provided as examples. Other examples may differ from what is described with regard to FIGS. 2A-2C.

Figure 3B:
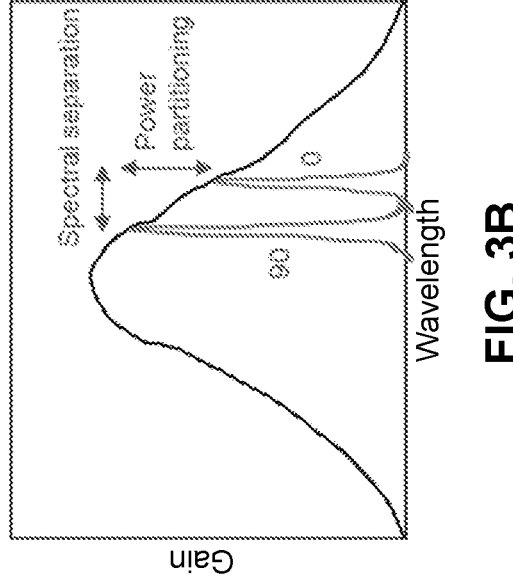
FIGS. 3A and 3B are diagrams illustrating examples associated with spectral separation of resonance wavelengths of light generated by the VCSEL including the asymmetric aperture.
Figure 3A:
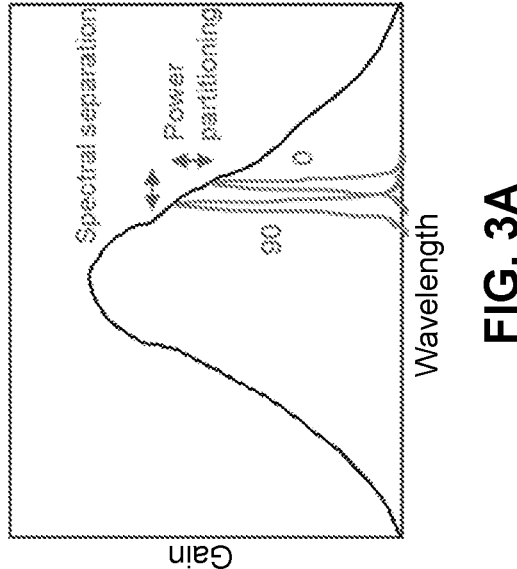

FIGS. 3A and 3B are diagrams illustrating examples associated with spectral separation of resonance wavelengths of light generated by the VCSEL 100.

As can be seen by comparing FIGS. 3A and 3B, a larger spectral separation of resonance wavelengths of different polarization states (e.g., the 0° polarization state and the 90° polarization state) enables a larger power partitioning and, therefore, improves stability of a dominant polarization state. That is, power partitioning is enhanced by increasing spectral separation of a resonance wavelength of a portion of light generated by the VCSEL 100 that has a first polarization and a resonance wavelength of a portion of light generated by the VCSEL 100 that has a second polarization. As noted above, the confinement aperture 112 and/or the output aperture 124 can have an asymmetric shape that increases this spectral separation, meaning that the asymmetric shape of the confinement aperture 112 and/or the output aperture 124 can improve polarization stability of the VCSEL 100 (e.g., as compared to a conventional VCSEL). In some implementations, the improved power partitioning also improves a PER of the VCSEL 100.

As indicated above, FIGS. 3A and 3B are provided as an example. Other examples may differ from what is described with regard to FIGS. 3A and 3B.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the term "component" is intended to be broadly construed as hardware, firmware, and/or a combination of hardware and software.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

When a component or one or more components (e.g., a laser emitter or one or more laser emitters) is described or claimed (within a single claim or across multiple claims) as performing multiple operations or being configured to perform multiple operations, this language is intended to broadly cover a variety of architectures and environments. For example, unless explicitly claimed otherwise (e.g., via the use of "first component" and "second component" or other language that differentiates components in the claims), this language is intended to cover a single component performing or being configured to perform all of the operations, a group of components collectively performing or being configured to perform all of the operations, a first component performing or being configured to perform a first operation and a second component performing or being configured to perform a second operation, or any combination of components performing or being configured to perform the operations. For example, when a claim has the form "one or more components configured to: perform X; perform Y; and perform Z," that claim should be interpreted to mean "one or more components configured to perform X; one or more (possibly different) components configured to perform Y; and one or more (also possibly different) components configured to perform Z."

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," "over," "under," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical-cavity surface-emitting laser (VCSEL), comprising:

a substrate;

a first mirror structure over the substrate;

a cavity region over the first mirror structure and to generate light, wherein the cavity region is to cause a resonance wavelength of a first portion of the light and a resonance wavelength of a second portion of the light to be offset from a gain peak of the VCSEL by at least a threshold amount, wherein the first portion of the light has a first polarization and the second portion of the light has a second polarization, and wherein an offset of the resonance wavelength of the first portion of the light from the gain peak is different from an offset of the resonance wavelength of the second portion of the light from the gain peak;

a confinement layer that forms a confinement aperture adjacent to or near the cavity region, wherein the confinement aperture has an asymmetric shape to cause spectral separation of the resonance wavelength of the first portion of the light and the resonance wavelength of the second portion of the light;

a second mirror structure over the confinement layer; and one or more layers that form an output aperture over the second mirror structure.

2. The VCSEL of claim 1, wherein an indium (In) content of a quantum well in the cavity region is in a range from approximately 6% to approximately 18%.

3. The VCSEL of claim 1, wherein a thickness of a quantum well in the cavity region is in a range from approximately 2 nanometers to approximately 16 nanometers.

4. The VCSEL of claim 1, wherein a thickness of a quantum well barrier layer in the cavity region is in a range from approximately 2 nanometers to approximately 25 nanometers.

5. The VCSEL of claim 1, wherein the confinement aperture has one of an elliptical shape, an oval shape, a rectangular shape, a diamond shape, or a hexagonal shape.

6. The VCSEL of claim 1, wherein the output aperture has an asymmetric shape to cause further spectral separation of the resonance wavelength of the first portion of the light and the resonance wavelength of the second portion of the light.

7. The VCSEL of claim 1, wherein at least one of the offset of the resonance wavelength of the first portion of the light from the gain peak or the offset of the resonance wavelength of the second portion of the light from the gain peak is in a range from approximately 8 nanometers to approximately 16 nanometers.

8. The VCSEL of claim 1, wherein a difference between the resonance wavelength of the first portion of the light and the resonance wavelength of the second portion of the light is in a range from approximately 0.015 nanometers to approximately 0.020 nanometers.

9. The VCSEL of claim 1, wherein the gain peak is blue-shifted with respect to the resonance wavelength of the first portion of the light and the resonance wavelength of the second portion of the light.

10. The VCSEL of claim 1, wherein the gain peak is red-shifted with respect to the resonance wavelength of the first portion of the light and the resonance wavelength of the second portion of the light.

11. An emitter, comprising:

a cavity region to generate light, wherein the cavity region is to cause a first resonance wavelength of a first portion of the light having a first polarization to be offset from a gain peak of the emitter by a first amount, and wherein the cavity region is to cause a second resonance wavelength of a second portion of the light having a second polarization to be offset from the gain peak of the emitter by a second amount that is different from the first amount; and a confinement layer that forms a confinement aperture, wherein the confinement aperture has a non-rotationally symmetric shape to cause spectral separation of the first resonance wavelength and the second resonance wavelength.

12. The emitter of claim 11, wherein an indium (In) content of a quantum well in the cavity region is in a range from approximately 6% to approximately 18%.

13. The emitter of claim 11, wherein a thickness of a quantum well in the cavity region is in a range from approximately 2 nanometers to approximately 16 nanometers.

14. The emitter of claim 11, wherein a thickness of a quantum well barrier layer in the cavity region is in a range from approximately 2 nanometers to approximately 25 nanometers.

15. The emitter of claim 11, further comprising one or more layers that form an output aperture, wherein the output aperture has a non-rotationally symmetric shape to cause further spectral separation of the first resonance wavelength and the second resonance wavelength.

16. The emitter of claim 11, wherein at least one of the offset of the first resonance wavelength from the gain peak or the offset of the second resonance wavelength from the gain peak is in a range from approximately 8 nanometers to approximately 16 nanometers.

17. The emitter of claim 11, wherein a difference between the first resonance wavelength of and the second resonance wavelength is in a range from approximately 0.015 nanometers to approximately 0.020 nanometers.

18. A device comprising:

a vertical-cavity surface-emitting laser (VCSEL), comprising:

a substrate;

a first mirror structure;

a cavity region to generate light, wherein one or more characteristics of the cavity region cause a resonance wavelength of a first portion of the light and a resonance wavelength of a second portion of the light to be offset from a gain peak of the VCSEL by at least a threshold amount, wherein a polarization of the first portion of the light is different from a polarization of the second portion of the light, and wherein the resonance wavelength of the first portion of the light is different from the resonance wavelength of the second portion of the light;

a confinement layer that forms a confinement aperture, wherein a shape of the confinement aperture causes separation of the resonance wavelength of the first portion of the light and the resonance wavelength of the second portion of the light;

a second mirror structure over the confinement layer; and one or more layers that form an output aperture over the second mirror structure.

19. The device of claim 18, wherein at least one of:

an indium (In) content of a quantum well in the cavity region is in a range from approximately 6% to approximately 18%, a thickness of a quantum well in the cavity region is in a range from approximately 2 nanometers to approximately 16 nanometers, or a thickness of a quantum well barrier layer in the cavity region is in a range from approximately 2 nanometers to approximately 25 nanometers.

20. The device of claim 18, wherein at least one of the offset of the resonance wavelength of the first portion of the light from the gain peak or the offset of the resonance wavelength of the second portion of the light from the gain peak is in a range from approximately 8 nanometers to approximately 16 nanometers.

* * * * *